US012607815B2

(12) United States Patent
Mohajer et al.

(10) Patent No.: US 12,607,815 B2
(45) Date of Patent: Apr. 21, 2026

(54) LIQUID-COOLED SMALL FORM FACTOR PLUGGABLE OPTICAL MODULE

(71) Applicant: Ciena Corporation, Hanover, MD (US)

(72) Inventors: Behzad Mohajer, Vancouver (CA); Marko Nicolici, Ottawa (CA); Peter Ajersch, Ottawa (CA); Simon J. Shearman, Carleton Place (CA); Michael Bishop, Ottawa (CA)

(73) Assignee: Ciena Corporation, Hanover, MD (US)

( * ) Notice: Subject to any disclaimer, the term of this patent is extended or adjusted under 35 U.S.C. 154(b) by 173 days.

(21) Appl. No.: 18/432,141

(22) Filed: Feb. 5, 2024

(65) Prior Publication Data

US 2025/0123454 A1    Apr. 17, 2025

Related U.S. Application Data

(60) Provisional application No. 63/544,516, filed on Oct. 17, 2023.

(51) Int. Cl.
| | |
|---|---|
| *G02B 6/42* | (2006.01) |
| *F28F 9/02* | (2006.01) |
| *H05K 7/20* | (2006.01) |

(52) U.S. Cl.
CPC .......... *G02B 6/4268* (2013.01); *F28F 9/0258* (2013.01); *G02B 6/4278* (2013.01); *H05K 7/20254* (2013.01); *H05K 7/20272* (2013.01)

(58) Field of Classification Search
CPC .. G02B 6/4268; G02B 6/4278; G02B 6/3897; H05K 7/20254; H05K 7/20272; F28F 9/0258
See application file for complete search history.

(56) References Cited

U.S. PATENT DOCUMENTS

| | | | |
|---|---|---|---|
| 11,729,941 B2 | 8/2023 | Yang | |
| 2006/0002086 A1* | 1/2006 | Teneketges | H01L 23/473 257/E23.098 |
| 2014/0262180 A1* | 9/2014 | Lyon | F28F 9/02 165/173 |
| 2017/0192185 A1* | 7/2017 | Kelty | G02B 6/4269 |

(Continued)

OTHER PUBLICATIONS

Mar. 24, 2025 International Search Report issued in corresponding PCT Application No. PCT/US2024/051533.

*Primary Examiner* — Adam B Dravininkas
(74) *Attorney, Agent, or Firm* — Clements Bernard Walker; Christopher L. Bernard

(57) ABSTRACT

A pluggable optical module, including: a body; a coldplate coupled to the body; and a pair of cooling fluid supply and return line quick disconnects coupled to the coldplate and extending from the coldplate and the body. Optionally, the coldplate is integrated into the body. Alternatively, the coldplate is coupled adjacent to an exterior surface of the body using one or more securement mechanisms, and a thermal interface material is disposed between the coldplate and the exterior surface of the body. The body and the coldplate are adapted to be inserted into a host card, circuit pack, or module as an integrated unit, with the pair of cooling fluid supply and return line quick disconnects adapted to fluidly engage a corresponding pair of cooling fluid supply and return line quick disconnects coupled to fluid supply and return manifolds or plenums disposed in the host card, circuit pack, or module.

19 Claims, 15 Drawing Sheets

(56)      References Cited

U.S. PATENT DOCUMENTS

| | | | |
|---|---|---|---|
| 2019/0246523 A1* | 8/2019 | Boyden | H05K 7/20445 |
| 2020/0006884 A1* | 1/2020 | Weltsch | H01R 13/514 |
| 2020/0077541 A1 | 3/2020 | Sharf | |
| 2020/0229321 A1* | 7/2020 | Dogruoz | G02B 6/4269 |
| 2021/0109296 A1* | 4/2021 | Omura | B29C 45/14065 |
| 2021/0112683 A1* | 4/2021 | Mohajer | G02B 6/4261 |
| 2021/0132311 A1* | 5/2021 | Shearman | G02B 6/4261 |
| 2021/0210894 A1* | 7/2021 | Rivaud | G02B 6/4261 |
| 2021/0400843 A1* | 12/2021 | Yang | H05K 9/0058 |
| 2023/0039781 A1 | 2/2023 | Mohajer et al. | |

* cited by examiner

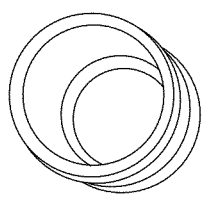
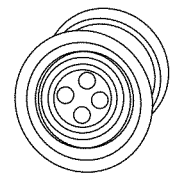
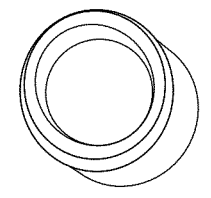
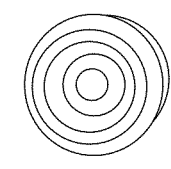
42b
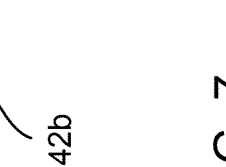
FIG. 7
54c
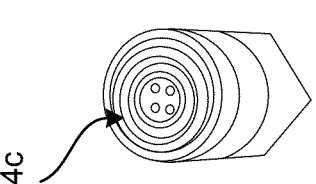
54b
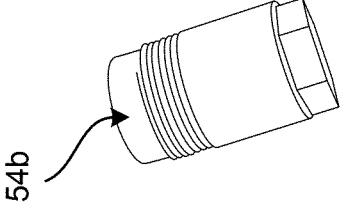
54a
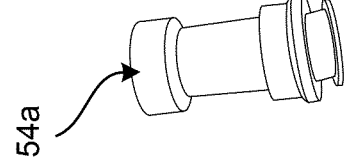

LIQUID-COOLED SMALL FORM FACTOR PLUGGABLE OPTICAL MODULE

CROSS-REFERENCE TO RELATED APPLICATION

The present disclosure claims the benefit of priority of U.S. Provisional Patent Application No. 63/544,516, filed on Oct. 17, 2023, and entitled "LIQUID-COOLED SMALL FORM FACTOR PLUGGABLE OPTICAL MODULE," the contents of which are incorporated in full by reference.

TECHNICAL FIELD

The present disclosure relates generally to the telecommunications and optical networking fields. More particularly, the present disclosure relates to a liquid-cooled small form factor pluggable optical module (POM).

BACKGROUND

Conventionally, POMs are cooled using air-cooled riding heatsinks, where the POM interfaces with the heatsink in a dry/sliding manner when the POM is inserted into the associated card, circuit pack, or module, which introduces a significant dry/sliding thermal penalty. Replacing air-cooled riding heatsinks with externally placed liquid-cooled riding coldplates may not solve the problem of this dry/sliding thermal penalty, and rather poses an additional problem of bulky quick disconnects.

The existing solutions suffer from significant shortcomings. Lower performance results from the dry/sliding interface thermal penalty, along with the shortcoming of air-cooling for high-power pluggable optics. Bulky external quick disconnects prevent making a compact design and maintaining minimum plug-to-plug pitch—limiting card, circuit pack, or module faceplate port density. There is often not enough space for two separate manifolds on a printed circuit board (PCB) of a card, circuit pack, or module, with limited height available.

The present background is provided as illustrative environmental context only and should not be construed to be limiting in any manner. It will be readily apparent to those of ordinary skill in the art that the principles and concepts of the present disclosure may be implemented in other environmental contexts equally, without limitation.

SUMMARY

The present disclosure provides a liquid-cooled small form factor POM that utilizes embedded quick disconnects that are arranged to minimize plug-to-plug pitch and mate with a dual-flow (i.e., 2-plenum) manifold assembly that is disposed on the PCB of a card, circuit pack, or module. By integrating liquid cooling into the POM, the dry/sliding interface is eliminated, as well as the dry/sliding thermal penalty associated with riding heatsinks. Further, using liquid cooling meaningfully improves cooling performance. A new POM may be provided, and existing POMs may be upgraded to integrate liquid cooling and eliminate this dry/sliding interface. The female quick disconnect array associated with the dual-flow manifold assembly complements the minimized plug-to-plug pitch of the POM. Two manifolds or plenums combined into one manifold assembly reduce the size and cost of fluid distribution. This idea can be used in tight spaces to allow more space for other devices. Thus, the present disclosure allows for the thermal management of high-power POMs (e.g., QSFP-DDs) which otherwise are extremely challenging to cool, allows for increasing the port density of high-power plugs at the faceplate, and allows future liquid cooling to be achieved in limited space applications. The present disclosure also allows for the effective liquid cooling of components disposed at the nose of a POM, which usually protrudes out of the associated faceplate and, in conventional cooling solutions, does not make thermal contact with the riding heatsink or coldplate.

The present disclosure provides the integration of liquid cooling into small form factor POMs while maintaining minimum plug-to-plug pitch and the integration of blind mate liquid quick disconnects into the POMs. This integration can be done in two ways: making a liquid-cooled plug (during the plug manufacturing process) by replacing the plug case top with a coldplate equipped with liquid quick disconnects and upgrading an existing plug by attaching a coldplate featuring liquid quick disconnects to the plug case top using a thermal interface material. Thus, the present disclosure enables turning existing POMs into liquid-cooled POMs. A female quick disconnect array at the dual-flow manifold assembly combines multiple embedded female quick disconnects (thereby minimizing the spacing required). The dual-flow (i.e., 2-plenum) manifold assembly is provided in combination with the female quick disconnect array. This allows parallel flow to faceplate liquid-cooled POMs. Tapered distribution channels may also help control flow rate along the length of the manifold assembly.

In one embodiment, the present disclosure provides a pluggable optical module, including: a body; a coldplate coupled to the body; and a pair of cooling fluid supply and return line quick disconnects coupled to the coldplate and extending from the coldplate and the body. The coldplate extends to a nose of the body and is disposed adjacent to components disposed in the nose of the body. Optionally, the coldplate is integrated into the body. Alternatively, the coldplate is coupled adjacent to an exterior surface of the body using one or more securement mechanisms, and a thermal interface material is disposed between the coldplate and the exterior surface of the body. The body and the coldplate are adapted to be inserted into a host card, circuit pack, or module as an integrated unit, with the pair of cooling fluid supply and return line quick disconnects adapted to fluidly engage a corresponding pair of cooling fluid supply and return line quick disconnects coupled to fluid supply and return manifolds or plenums disposed in the host card, circuit pack, or module. Optionally, the pair of cooling fluid supply and return line quick disconnects coupled to the coldplate are male quick disconnects. Optionally, the corresponding pair of cooling fluid supply and return line quick disconnects are female quick disconnects. Optionally, the pair of cooling fluid supply and return line quick disconnects are disposed diagonally on an insertion end of the pluggable optical module, with each of the pair of cooling fluid supply and return line quick disconnects vertically offset with respect to a lateral axis of the coldplate and/or the body. The vertical offset minimizes plug-to-plug pitch on a faceplate of a host card, circuit pack, or module when the pluggable optical module is inserted into the faceplate of the host card, circuit pack, or module. Alternatively, the pair of cooling fluid supply and return line quick disconnects are disposed horizontally on an insertion end of the pluggable optical module, with each of the pair of cooling fluid supply and return line quick disconnects side-by-side adjacent along a lateral axis of the coldplate and/or the body. Optionally, each of the pair of cooling fluid supply and return line quick disconnects is a separate component that is coupled to the coldplate and the body using one or more securement mechanisms. Alternatively, the pair of cooling fluid supply and return line quick disconnects are coupled together as a single component that is coupled to the coldplate and the body using one or more securement mechanisms.

In another embodiment, the present disclosure provides a female quick disconnect array assembly, including: a structure defining a plurality of embedded female quick disconnect outer housings; and a plurality of female quick disconnect inner valves disposed within the plurality of embedded female quick disconnect outer housings; where the plurality of embedded female quick disconnect outer housings and the plurality of female quick disconnect inner valves form a plurality of female quick disconnects adapted to receive a corresponding plurality of male quick disconnects associated with one or more pluggable optical modules. Each of the embedded female quick disconnect outer housings is sized to accommodate quick disconnect misalignment and receive a sealing O-ring of the associated inner valve against a back wall of the embedded female quick disconnect outer housing to prevent leakage. Optionally, the female quick disconnect array assembly further includes a wall coupled to the structure to secure the plurality of female quick disconnect inner valves within the plurality of embedded female quick disconnect outer housings. Optionally, the structure is fluid coupled to cooling fluid supply and return lines via one or more plenums or manifolds. Alternatively, the structure is a manifold including plenums coupled to cooling fluid supply and return lines. Optionally, a fluid supply-return pair of the female quick disconnects are disposed diagonally on a face of the structure, with each of the pair of the female quick disconnects vertically offset with respect to a lateral axis of the structure. Alternatively, a fluid supply-return pair of the female quick disconnects are disposed horizontally on a face of the structure, with each of the pair of the female quick disconnects side-by-side adjacent along a lateral axis of the structure. Optionally, the structure defines one or more recesses or cutouts, front-to-back, in a top and/or bottom surface of the structure, providing one or more airflow channels through and around the structure.

In a further embodiment, the present disclosure provides a method for providing a pluggable optical module, including: providing a pluggable optical module body; coupling a coldplate adjacent to an exterior surface of the pluggable optical module body using one or more securement mechanisms; and disposing a thermal interface material is between the coldplate and the exterior surface of the pluggable optical module body; where the pluggable optical module body and the coldplate are adapted to be inserted into a host card, circuit pack, or module as an integrated unit.

It will be readily apparent to those of ordinary skill in the art that aspects and features of each of the described embodiments may be incorporated, omitted, and/or combined as desired in a given application, without limitation.

BRIEF DESCRIPTION OF THE DRAWINGS

The present disclosure is illustrated and described with reference to the various drawings, in which like reference numbers are used to denote like assembly components/method steps, as appropriate, and in which:

FIG. 7 illustrates a typical female quick disconnect;

FIG. 8B illustrates a rear perspective view of the female quick disconnect array of FIG. 8A.

It will be readily apparent to those of ordinary skill in the art that aspects and features of each of the illustrated embodiments may be incorporated, omitted, and/or combined as desired in a given application, without limitation.

DETAILED DESCRIPTION

The present disclosure provides a cooling solution to address the challenging thermal demands associated with present and future small form factor POMs (e.g., QSFP-DDs). This cooling solution integrates liquid cooling directly into the bodies of the POMs, while desirably maintaining the maximum port density at the faceplate.

As alluded to above, instead of an air-cooled riding heatsink, a liquid-cooled riding coldplate may be used in a similar manner, which still suffers from the dry/sliding thermal penalty. In certain configurations that utilize integrated-coldplate assemblies, the design may incorporate conventional, bulky quick disconnects. These quick disconnects are typically suitable only for larger POM form factors, leading to a negative effect on the port density. In such designs, two separate manifolds are used for the supply and return lines where liquid connections are mated. Quick disconnects are usually installed on the manifolds (e.g. screwed on externally) instead of being embedded in the manifolds. Female quick disconnects are usually standalone, two-piece parts (including an inner valve and an outer housing in a typical configuration).

Figure 1:
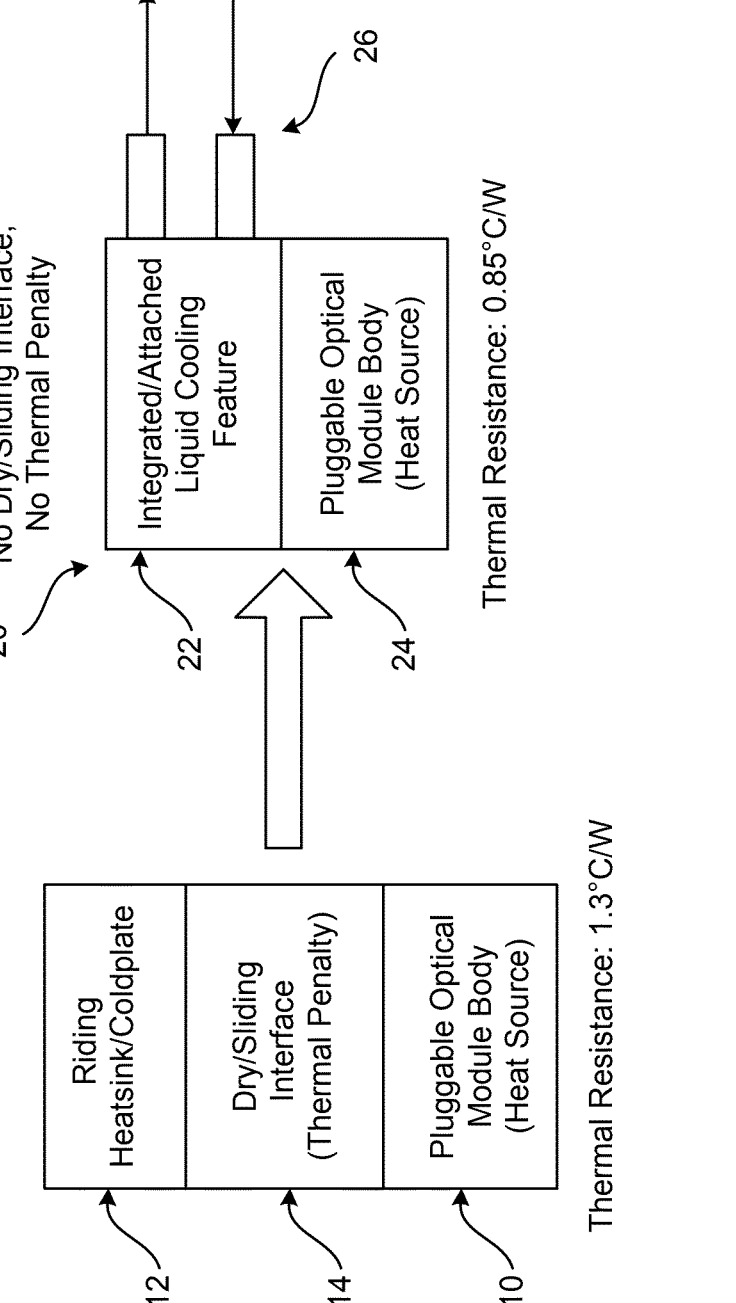
FIG. 1 illustrates the elimination of a dry/sliding interface associated with a POM.

Referring to FIG. 1, the conventional method for cooling a POM 10 is to use a riding heatsink/coldplate 12 at the top of the POM 10. The interface 14 between the POM 10 and the riding heatsink/coldplate 12 is a sliding/dry contact interface, which introduces a significant temperature penalty, degrading the cooling performance. The higher the plug power, the larger the temperature penalty, making the thermal management of upcoming high-power POMs extremely challenging.

To address this issue, the POM 20 of the present disclosure utilizes a liquid cooling feature 22 that is integrated into or fixedly coupled to the body 24 of the POM 20, eliminating any sliding/dry contact interface. This liquid cooling feature 22 includes coolant supply and return lines 26 that are coupled to the associated manifold assembly disposed on the PCB of the associated card, circuit pack, or module via blind-mate quick disconnects when the POM 20 is inserted into the card, circuit pack, or module.

Figure 2A:
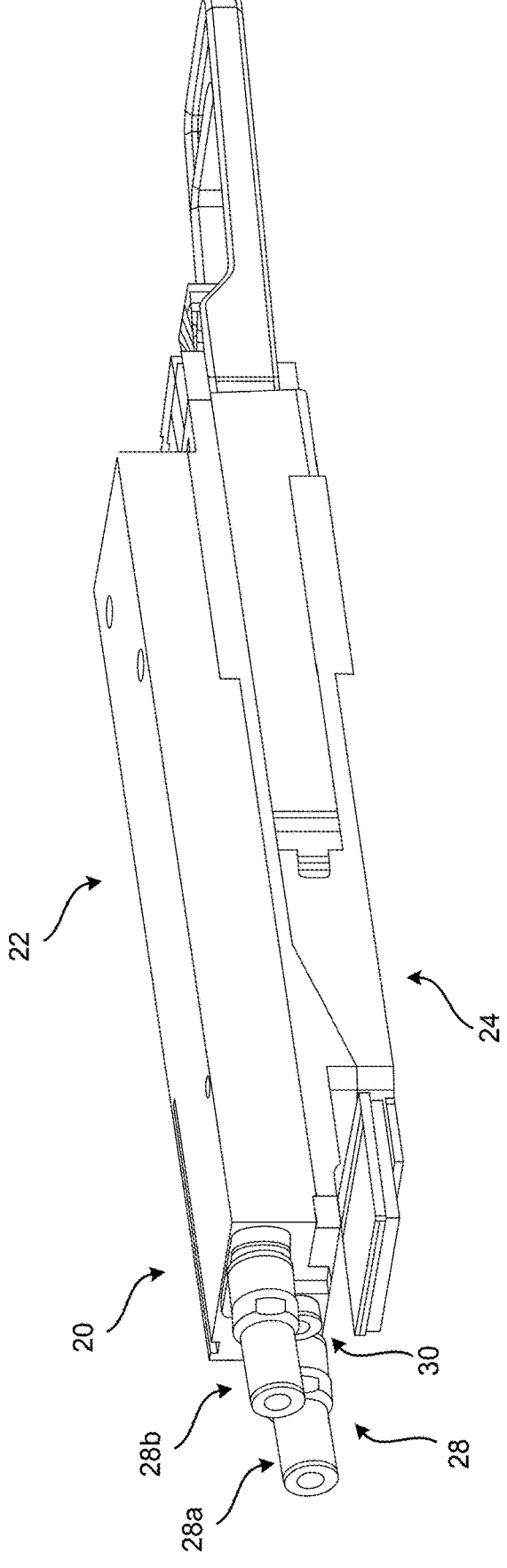
FIG. 2A illustrates a perspective view of a liquid-cooled POM with diagonally disposed liquid connectors.
Figure 2B:
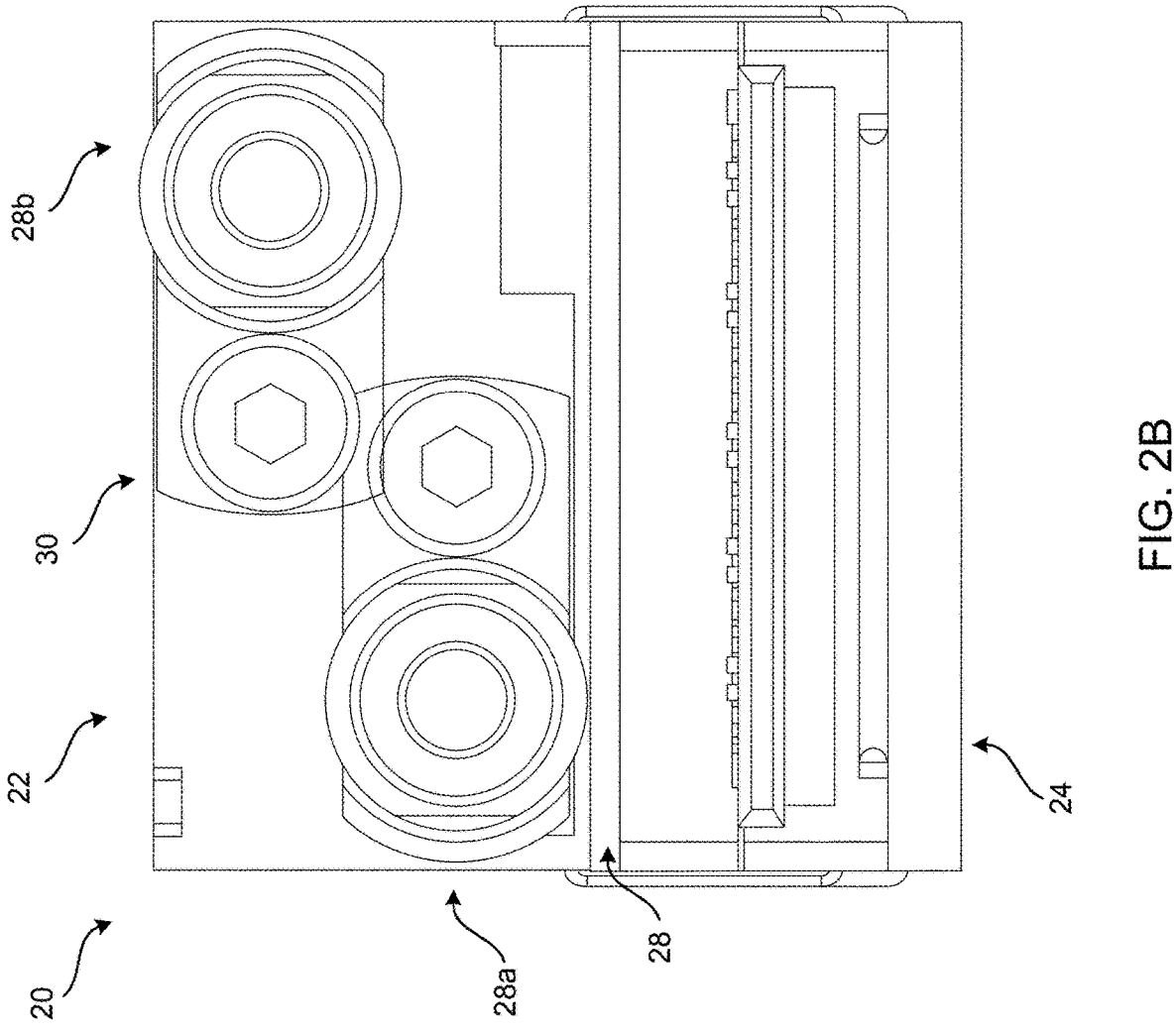
FIG. 2B illustrates a back view of the liquid-cooled POM of FIG. 2A.

Referring to FIGS. 2, FIG. 2A illustrates a perspective view of a liquid-cooled POM with diagonally disposed liquid connectors, and FIG. 2B illustrates a back view of the liquid-cooled POM of FIG. 2A. As shown, the liquid-cooled small form factor POM 20 of the present disclosure includes a POM body 24 that contains both conventional POM components and includes the integrated or attached liquid cooling feature 22 at the top (or bottom) of the POM body 24. The conventional POM components are well known to those of ordinary skill in the art and are not described in greater detail for the sake of brevity. At the insertion end of the POM body 24, the POM 20 includes dripless, blind-mate liquid supply and return quick disconnects 28. In a typical application, due to the sizes associated with male quick disconnects and female quick disconnects and the space constraints associated with the POM and the card, circuit pack, or module, the POM 20 typically incorporates the male quick disconnects, while the female quick disconnects are typically incorporated into the associated manifold, although this arrangement can be reversed as permitted and desired in a given application. When the POM 20 is inserted in the host PCB, both the electrical connections and the liquid connections are made in a blind-mate manner. As is illustrated, in order to minimize the plug-to-plug pitch of the POM 20, the supply and return quick disconnects 28 on the POM 20 and on the manifold are diagonally offset, with one quick disconnect 28a disposed relatively below the lateral axis of the liquid cooling feature 22 and/or the POM 20 and one quick disconnect 28b disposed relatively above the lateral axis of the liquid cooling feature 22 and/or the POM 20. Thus, each quick disconnect 28 is vertically offset to a desired degree, one up and one down. Each quick disconnect 28 is secured to the liquid cooling feature 22 and/or the POM body 24 (i.e., the POM 20) by a screw 30 or other securement mechanism. It is contemplated that the quick disconnects 28 may, optionally, be manufactured in pairs, such that a single screw 30 or other securement mechanism can be used to secure both quick disconnects 28a, 28b simultaneously. Further, it is contemplated that the quick disconnects 28 may simply be threaded themselves and screwed into the liquid cooling feature 22 and/or POM body 24. Still further, where the plug-to-plug pitch and faceplate plug density are less of an issue, the supply and return quick disconnects 28 on the POM 20 and on the manifold may simply be horizontally offset, with both quick disconnects 28a, 28b disposed along the lateral axis of the liquid cooling feature 22 and/or the POM 20, with no vertical offset. This overall configuration not only takes advantage of the superior thermal properties of liquids to cool the POM 20, but also eliminates the need for an unattached, external heatsink/coldplate, which consequently eliminates the dry/sliding interface, further improving the thermal performance of the POM 20. Additionally, the horizontal placement of male quick disconnects results in a shorter POM 20, which leads to less airflow blockage for applications that require airflow intake to cool downstream devices.

Figure 3:
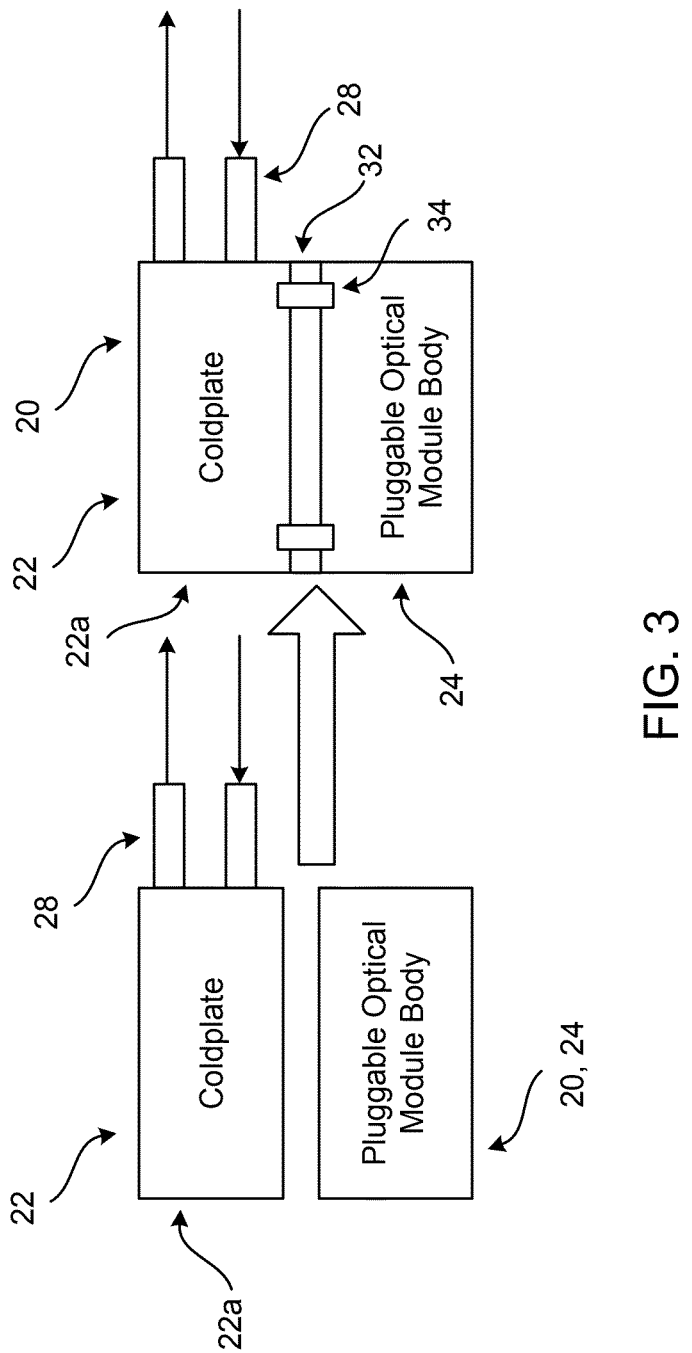
FIG. 3 illustrates upgrading a typical POM into a liquid-cooled plug via the attachment of a coldplate with diagonally disposed liquid connectors.

Referring to FIG. 3, the cooling feature integration/attachment of the present disclosure can be implemented in two ways: (1) replacing the case top of the POM 20 with the above-mentioned coldplate 22a or (2) attaching the coldplate 22a to the case top of the POM 20 using a thermal interface material 32 and a plurality of screws 34 or other securement mechanism(s). This latter option can be used on existing plugs to turn them into liquid-cooled plugs. While the thermal interface material is generally preferable, it is not mandatory. For example, there is a case to eliminate it altogether when the facing surfaces have sufficiently low flatness and roughness. The former option leads to a new plug, i.e. a taller plug featuring integrated liquid connectors. The latter option can be implemented on existing plugs, i.e. a common plug can be either air-cooled in an air-cooled system, and/or liquid-cooled in a liquid-cooled system by attaching the coldplate 22a to it. This option may require the development of a new plug standard, in which mounting point locations are specified on the body 24 of the plug for the attachment of the coldplate 22a.

As illustrated in FIG. 3, the coldplate 22a and quick disconnects 28 making up the liquid cooling feature 22 are secured to the case top of the body 24 of the POM 20 (which may otherwise be an air-cooled or liquid-cooled POM) via the plurality of screws 34 or other securement mechanism(s), with the thermal interface material 32 disposed between the liquid cooling feature 22 and the body 24 of the POM 20 such that heat transfer between the POM 20 and the liquid cooling feature 22 is promoted. With any integration or attachment of the liquid cooling feature 22 with/to the POM 20, the important aspect is that the coldplate 22a no longer slides with respect to the POM 20 as the POM is inserted into/removed from the associated card, circuit pack, or module, and there is thus no dry/sliding interface between the coldplate 22a and the POM 20. In essence, the coldplate 22a does not movably contact the POM 20, it is part of the POM 20, and is inserted/removed with the POM 20, supply and return connections being made via engagement/disengagement of the quick disconnects 28 at the rear of the POM 20. One advantage of providing a liquid-cooled POM is the ability to effectively cool the nose of the plug, which sits outside of the associated faceplate and, in conventional cooling solutions, does not make thermal contact with the riding heatsink/coldplate. Thus, the coldplate 22a of the present disclosure optionally extends to the nose of the POM 20, and is disposed, in part, adjacent to components in the nose of the POM 20.

Figure 4:
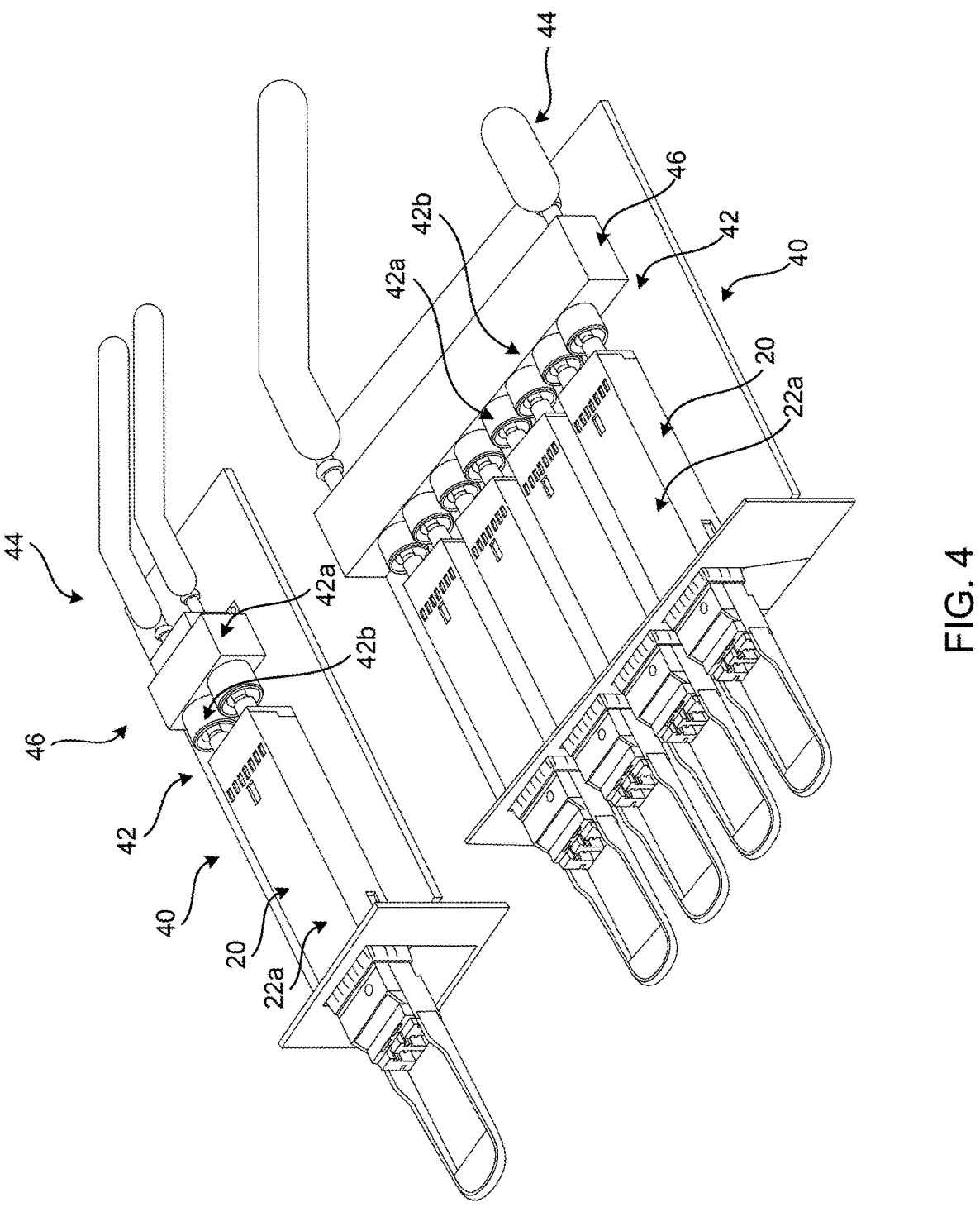
FIG. 4 illustrates liquid-cooled POMs using the full body of each female quick disconnect (i.e., the outer housing and inner valve), in both single-cage and ganged-cage variants, which undesirably takes up significant space in space-constrained applications.

Referring to FIG. 4, when a liquid-cooled POM 20 is inserted into a host card 40, the plug liquid connectors 42 are mated to the coolant lines 44 on the host card 40 for the supply and return of coolant. Both single-cage, accommodating one POM 20, and ganged-cage (accommodating multiple POMs 20) variants are illustrated. To achieve a seamless, blind-mate liquid connection, the coolant lines 44 on the host card 40 are typically equipped with female blind-mate liquid connectors 42b that can accommodate up to ±0.75 mm of radial misalignment between the male connectors 42a (on the POM(s) 20) and the female connectors 42b (on the host card 40), for example.

The coolant lines 44 on the host card 40 consist of two manifolds or plenums 46, a supply path to deliver fresh coolant to the POM coldplate(s) 22a, and a return path to collect hot coolant from the POM coldplate(s) 22a. The supply and return paths can be two separate manifolds 46 if there is enough space/height on the host card 40. Alternatively, two plenums 46 can be combined into one structure to save board space/height and evenly distribute parallel flow cooling paths. Further, the structure holding the connectors 42 can be the same as and integrally formed with or separate from and fluidly coupled to the manifold(s) or plenum(s) 46.

Maintaining minimum plug-to-plug pitch for QSFP-DDs is a point of interest of the present disclosure. The objective is to keep the QSFP-DD module width unchanged and achieve maximum port density at the faceplate.

Figure 5A:
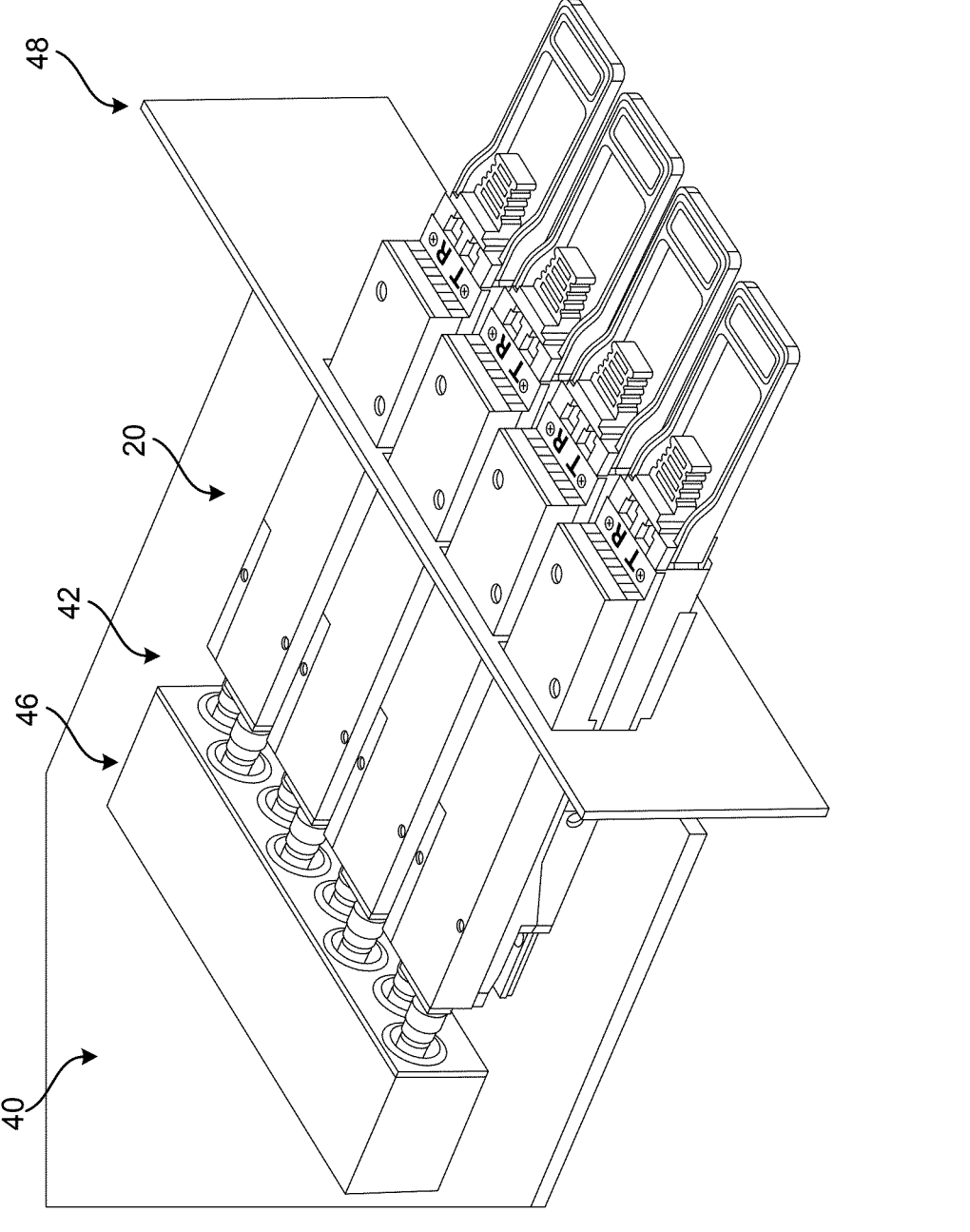
FIG. 5A illustrates a perspective view the manifold assembly and liquid-cooled plugs with the diagonal placement of liquid connectors to achieve a minimum plug-to-plug pitch via embedded female quick disconnects (i.e., only the inner valve)
Figure 5B:
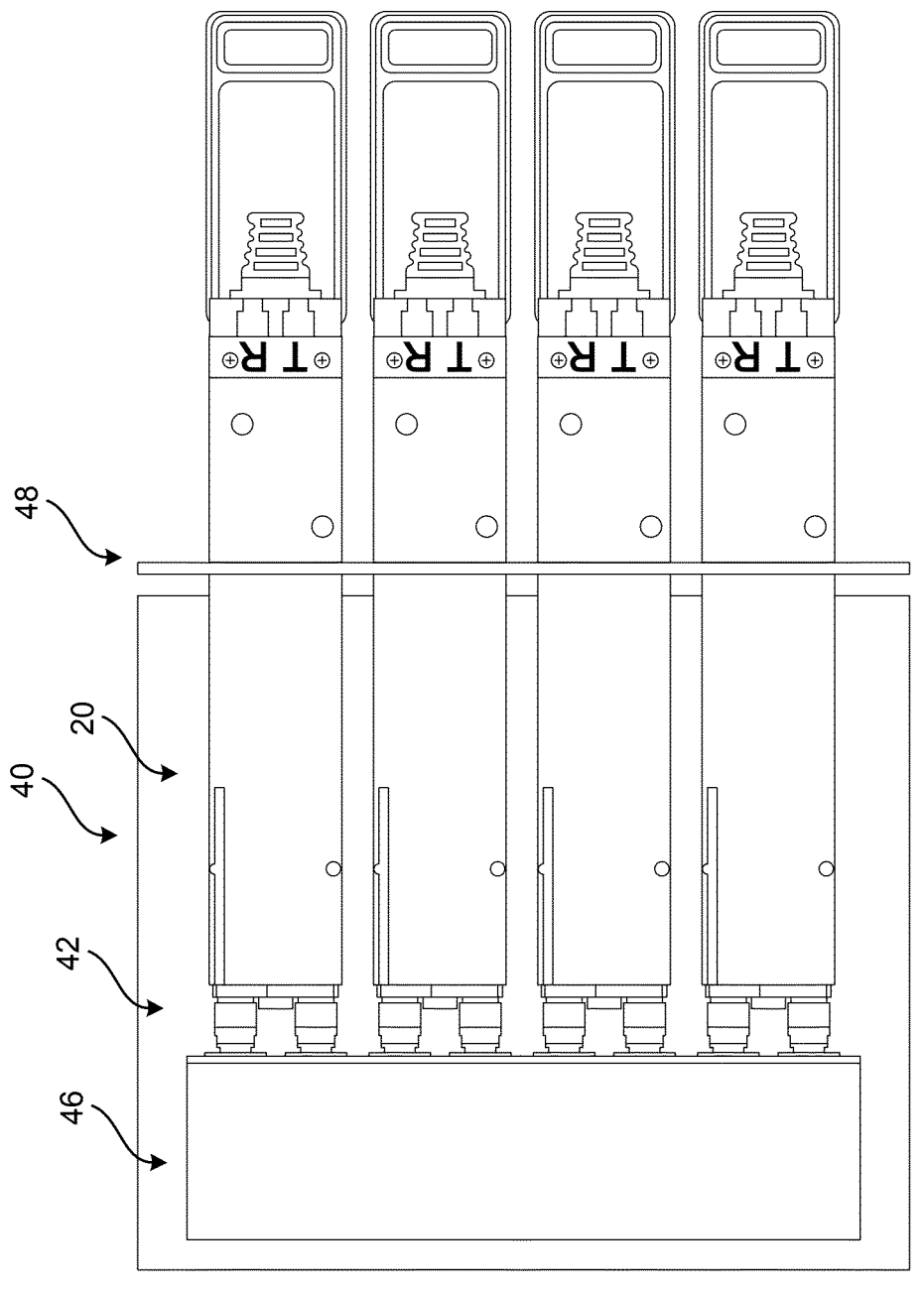
FIG. 5B illustrates a top view of the manifold assembly and liquid-cooled plugs of FIG. 5A.
Figure 5C:
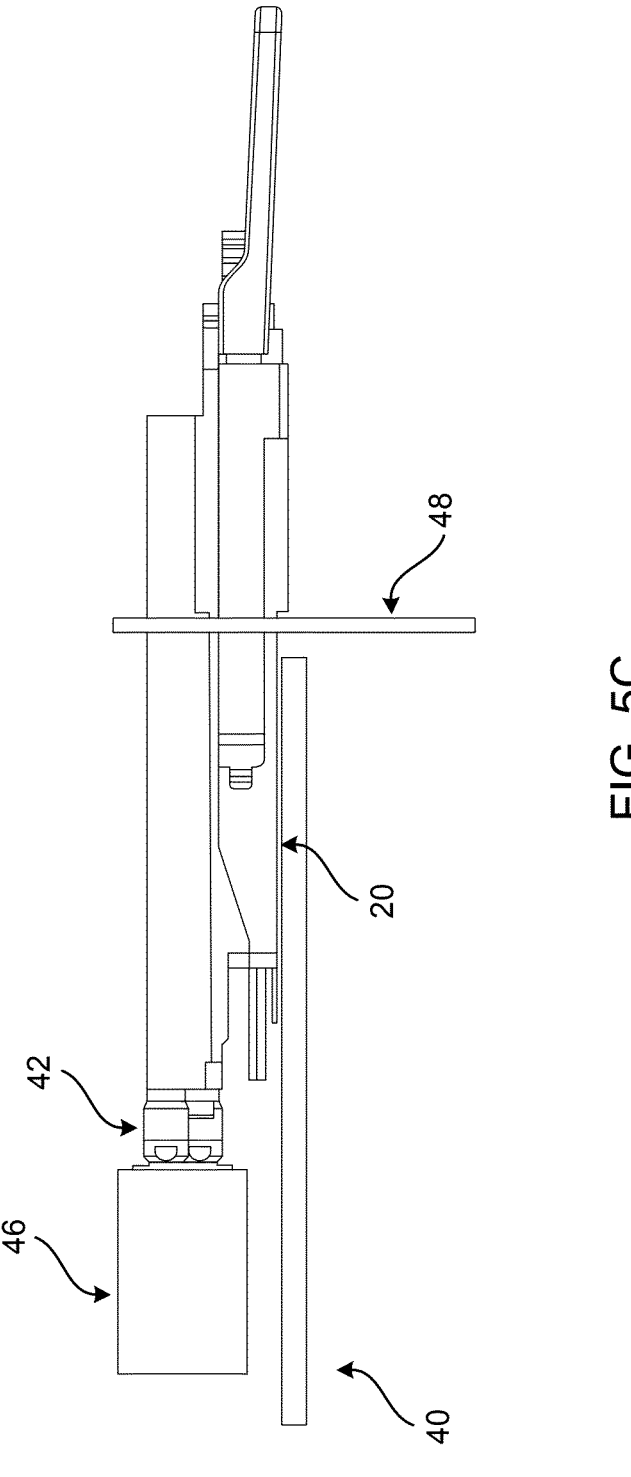
FIG. 5C illustrates a side view of the manifold assembly and liquid-cooled plugs of FIG. 5A.

Referring to FIG. 5, a perspective view (FIG. 5A), a top view (FIG. 5B), and a side view (FIG. 5C) of the manifold assembly and liquid-cooled plugs with the diagonal placement of liquid connectors to achieve a minimum plug-to-plug pitch via embedded female quick disconnects (i.e., only the inner valve) are illustrated. As shown, to maintain a smaller (e.g., 22.5 mm) pitch for QSFP-DD modules (i.e., the minimum possible pitch with single QSFP-DD cages), the liquid connectors 42 are disposed diagonally on both the plug 20 (i.e., male connectors 42a) and the manifold 46 (i.e., female connectors 42b). This diagonal quick disconnect mounting offers the smallest plug pitch for a specific liquid connector diameter, but does take up more height, resulting in taller POMs 20 and taller manifolds 46 within the space allowed in the host card/on the host PCB 40. In FIG. 5, the faceplate 48 of the host card/PCB 40 is also illustrated.

Figure 6B:
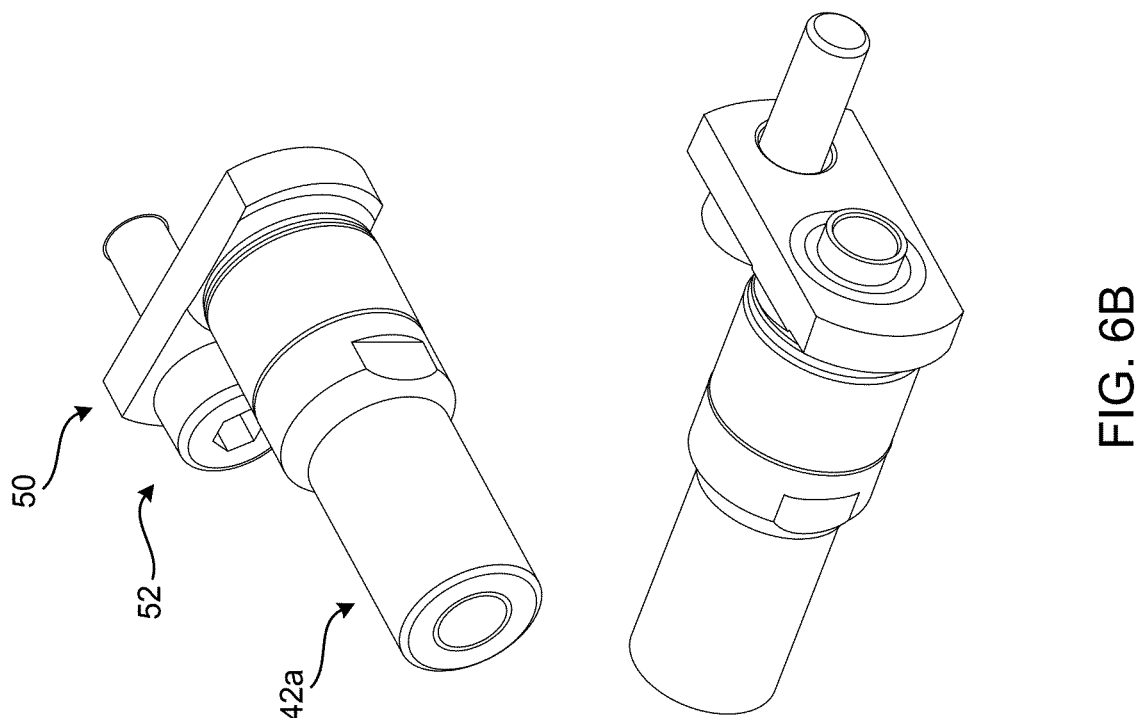
FIG. 6B illustrates a front perspective view of the components of the liquid-cooled plug of FIG. 6A.
Figure 6A:
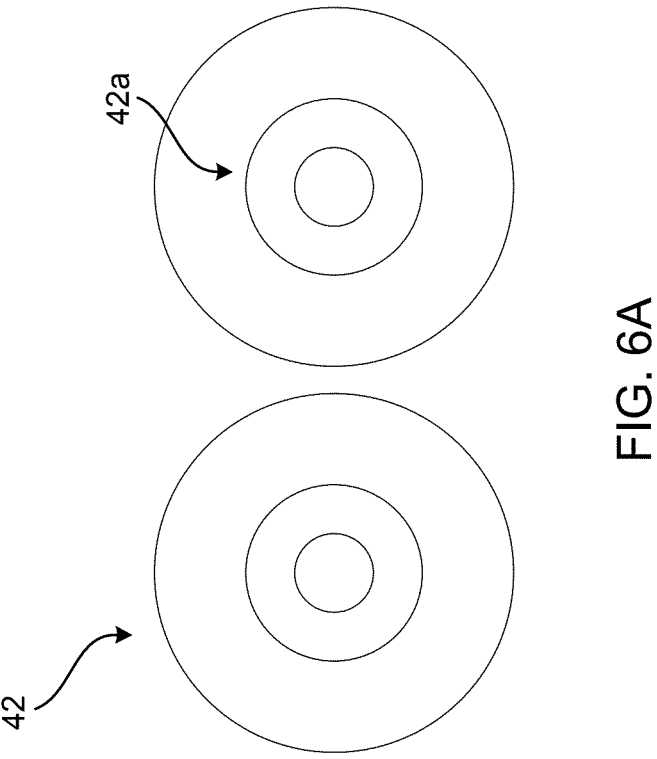
FIG. 6A illustrates a front view of liquid connectors of a liquid-cooled plug with the side-by-side (i.e., horizontal) placement of liquid connectors if the plug-to-plug pitch is larger.
Figure 6C:
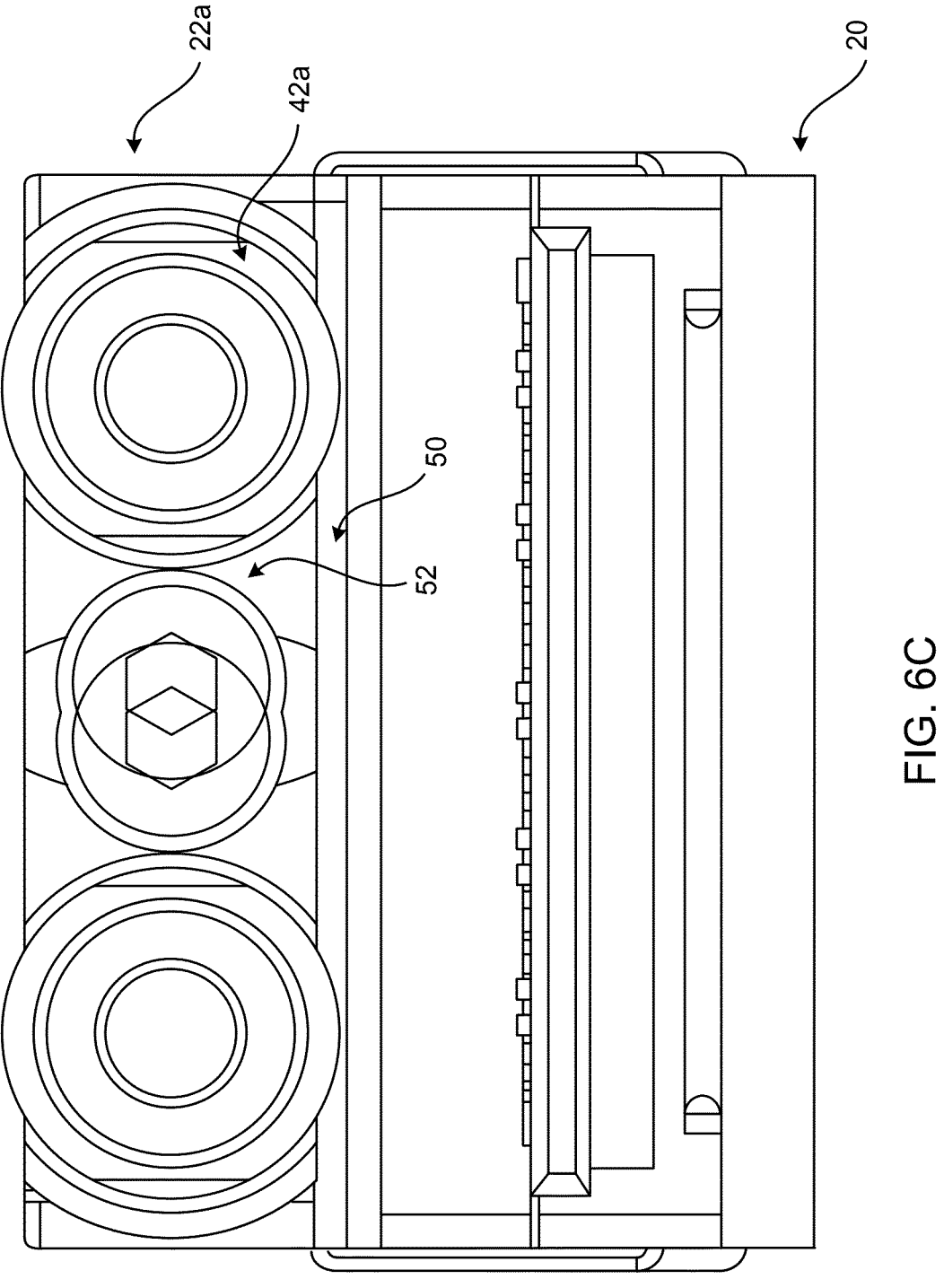
FIG. 6C illustrates a front view of an assembly of the components of the liquid-cooled plug of FIG. 6A, and FIG. 6C.

Referring to FIG. 6, a front view of liquid connectors of (FIG. 6A), a front perspective view of (FIG. 6B), and a front view of an assembly of (FIG. 6C) a liquid-cooled plug with the side-by-side (i.e., horizontal) placement of liquid connectors if the plug-to-plug pitch is larger are illustrated. To reduce the height required (i.e., making the POM 20 and manifold 46 shorter), the liquid connectors 42 may be disposed horizontally (i.e., side-by-side), which requires a wider spacing between QSFP-DD ports. A larger plug-to-plug pitch (e.g., >24.7 mm) allows placing the liquid connectors 42 side-by-side and minimizes the required height. As is illustrated, the male liquid connectors 42a can be mounted to the POM coldplate 22a and POM 20 using a single, common attachment point with overlapping flanges 50, i.e., two male liquid connectors 42a are attached with a single, common screw 52 in the middle. This allows the male liquid connectors 42a to be mounted on the same horizontal plane. Separate flanges 50 and screws 52 may also be used for separate connectors 42a, if desired and if space allows.

Referring to FIG. 7, female liquid connectors 42b are relatively bulky, especially when they are designed to accommodate a large misalignment tolerance. Consequently, it is challenging to make a compact design for a row of QSFP-DDs and maintain the minimum plug-to-plug pitch. A typical female blind-mate connector 42b consists of two major parts: an inner valve 54a and an outer housing 54b. The outer housing 54b confines the inner valve 54a, provides enough space for the inner valve 54a to accommodate the misalignment requirement, and pushes the inner valve's O-ring 54c against the back wall to seal the part and prevent leakage.

Figure 8A:
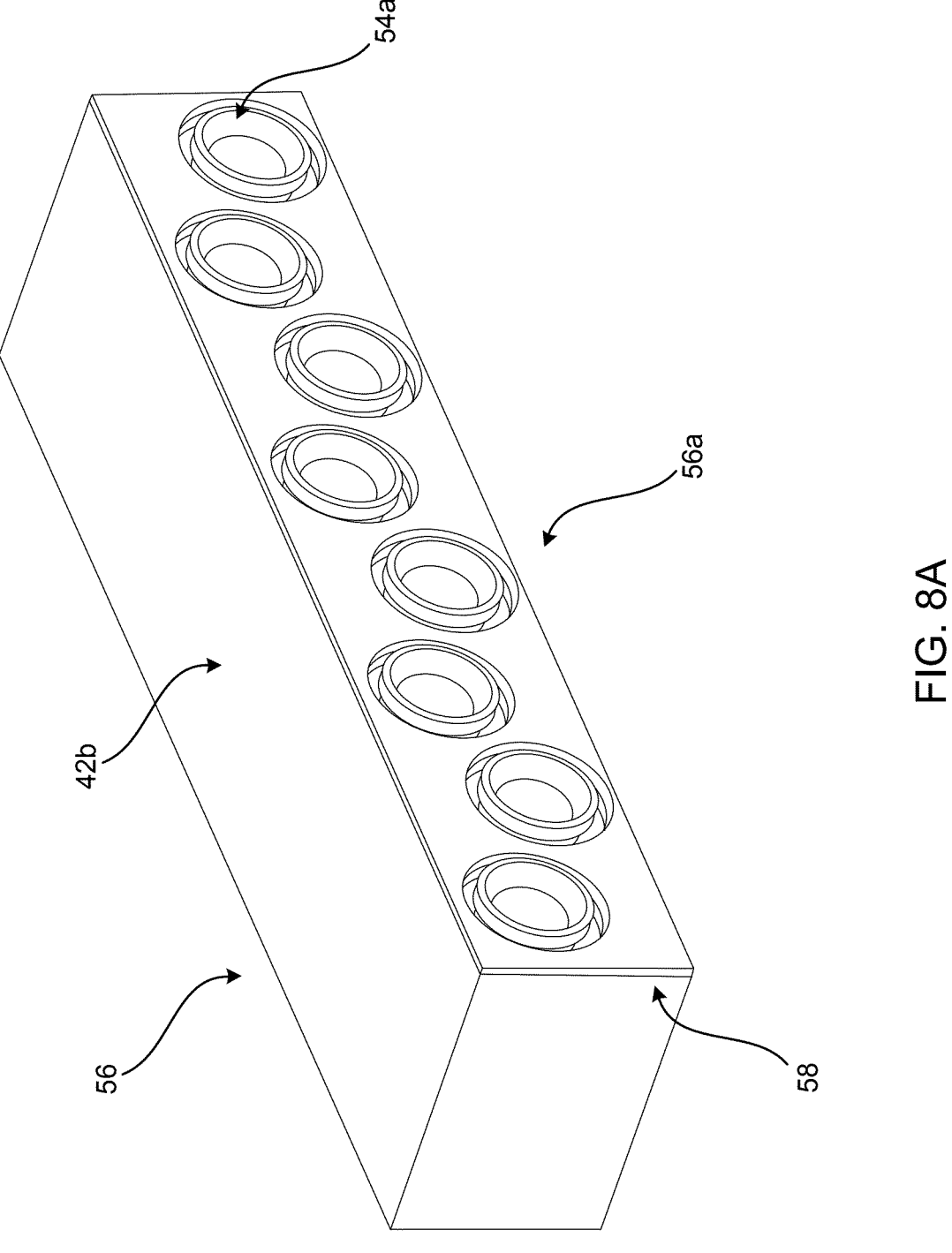
FIG. 8A illustrates a front perspective view of a female quick disconnect array—embedding the liquid connector inner valves into a single component, which may be integrated with or separate from the plenums of the dual-flow manifold assembly.
Figure 8B:
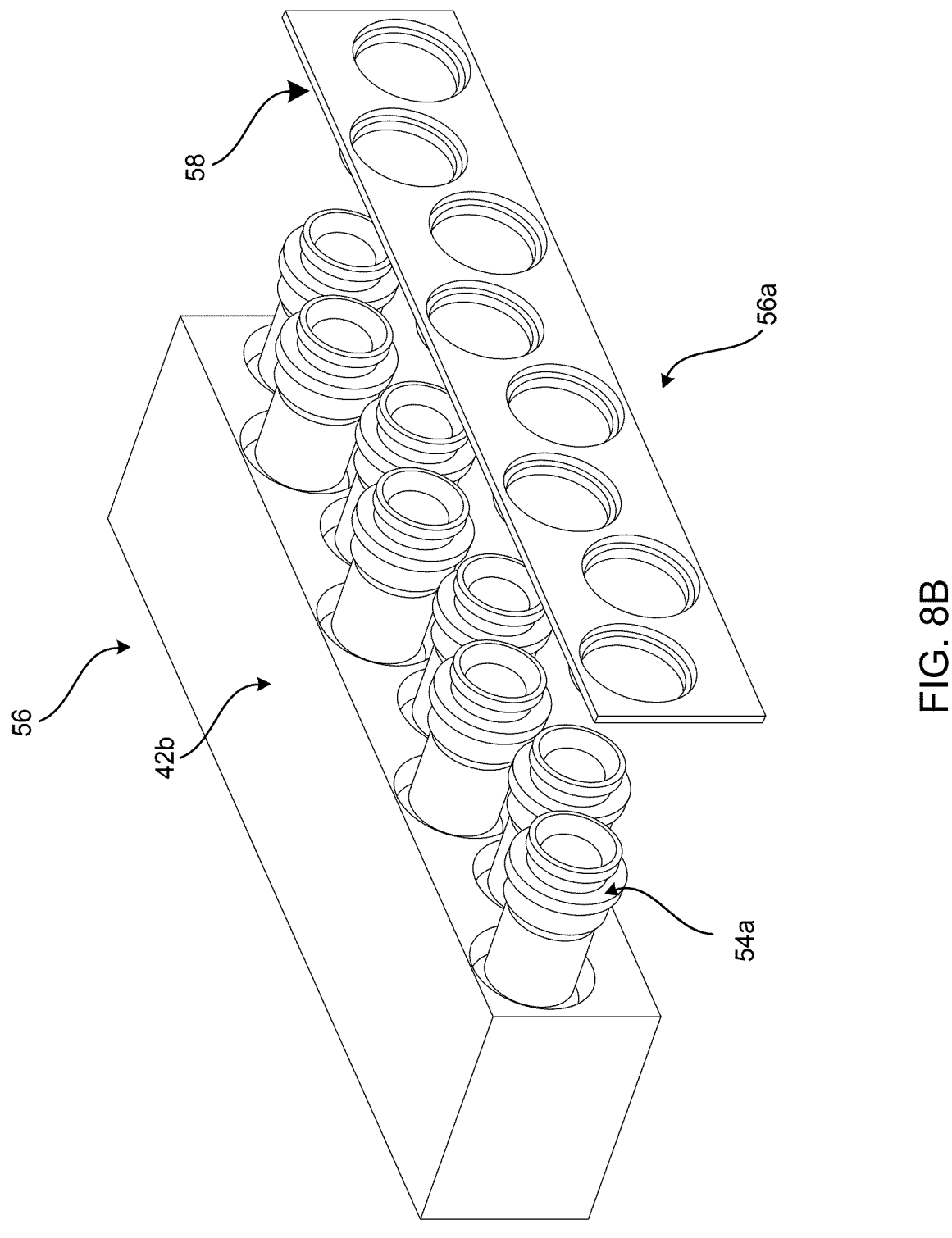
FIG. 8B illustrates a front, exploded perspective view of the female quick disconnect array of FIG. 8A.
Figure 8C:
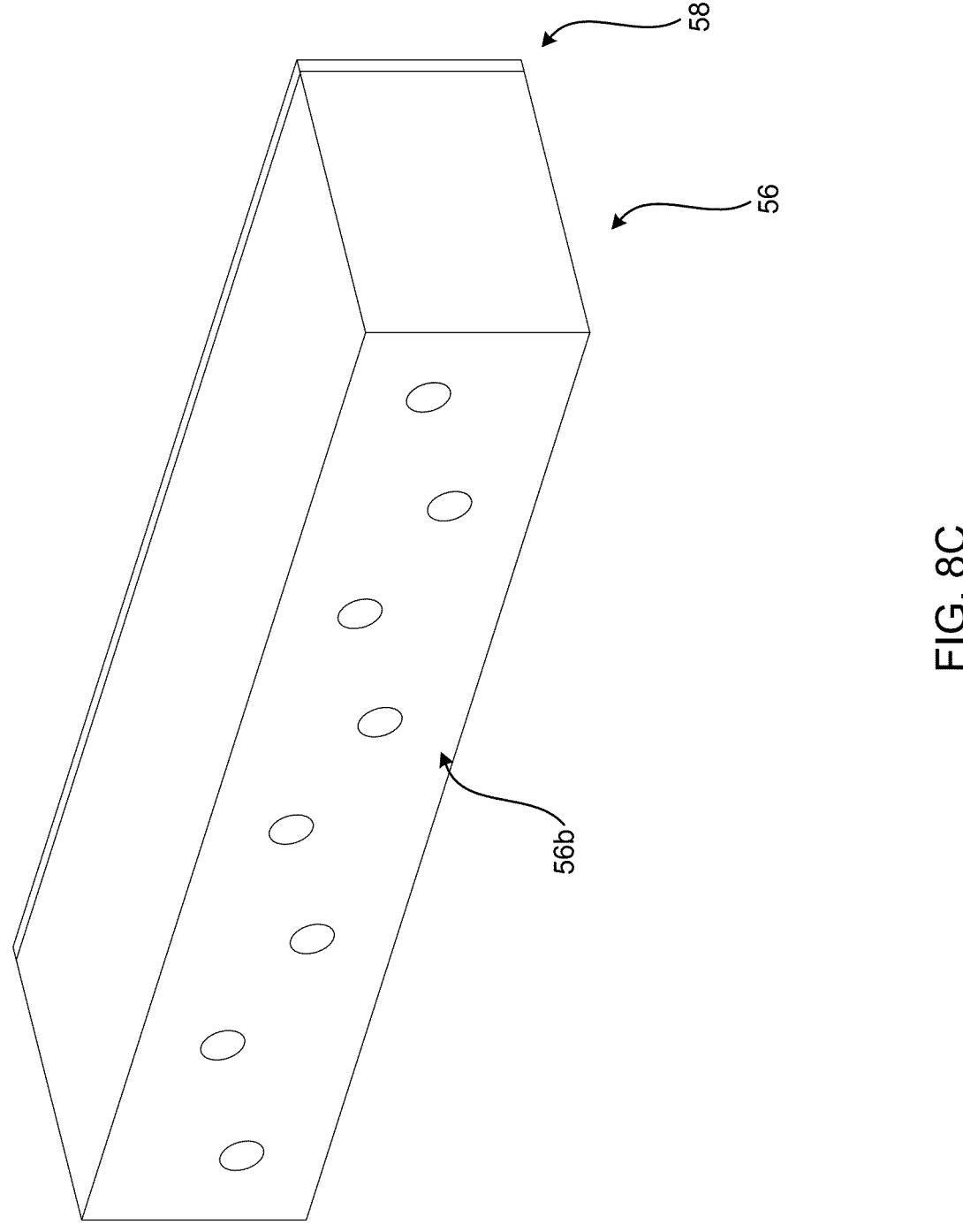

Referring to FIG. 8, a front perspective view (FIG. 8A), a front, exploded perspective view (FIG. 8B), and a rear perspective view (FIG. 8C) of a female quick disconnect array—embedding the liquid connector inner valves into a single component, which may be integrated with or separate from the plenums of the dual-flow manifold assembly, are illustrated. As shown, to make a compact design and maximize the port density (i.e., minimize the plug-to-plug pitch), the present disclosure combines the outer housings 54b of multiple connectors 42b into one structure 56 embedding the inner valves 54a, which may be the same as the manifold 46 or separate from, but fluidly coupled to, the manifold 46. Thus, a female quick disconnect array assembly is formed by the structure 56, which incorporates and embeds the outer housings 54b. Again, this female quick disconnect array can be a stand-alone part and be attached to the supply and return manifold(s)/plenum(s) 46. It can also be machined into the supply and return manifold(s)/plenum(s) 46. This approach eliminates the need for the bulky outer housings 54b of the female liquid connectors 42b, as these features are now incorporated and embedded into the structure 56 or manifold 46, allowing a more compact design. The diameters of the holes 56a in the female quick disconnect array are the same as the inner diameters of the female connector outer housings 54b, and are a function of the specified misalignment tolerance. The bottom of the holes 56b is where the inner valve's O-ring 54c is pushed against to seal the coolant flow. To hold the inner valves 54a inside the holes 56a and press against the back wall, a front panel 58 is mounted on the body of the structure 56. Alternatively, a rear panel could be used to confine the inner valves 54a in the female quick disconnect array. The components of the female quick disconnect array (i.e., the body and the front/rear panel) must necessarily be attached to one another after assembly of the inner valve and O-ring 54c. The panel component may be attached by various means, including brazing/soldering, or with screws. If brazing/soldering is used, the O-ring material must be compatible with the associated processing temperature.

Figure 9:
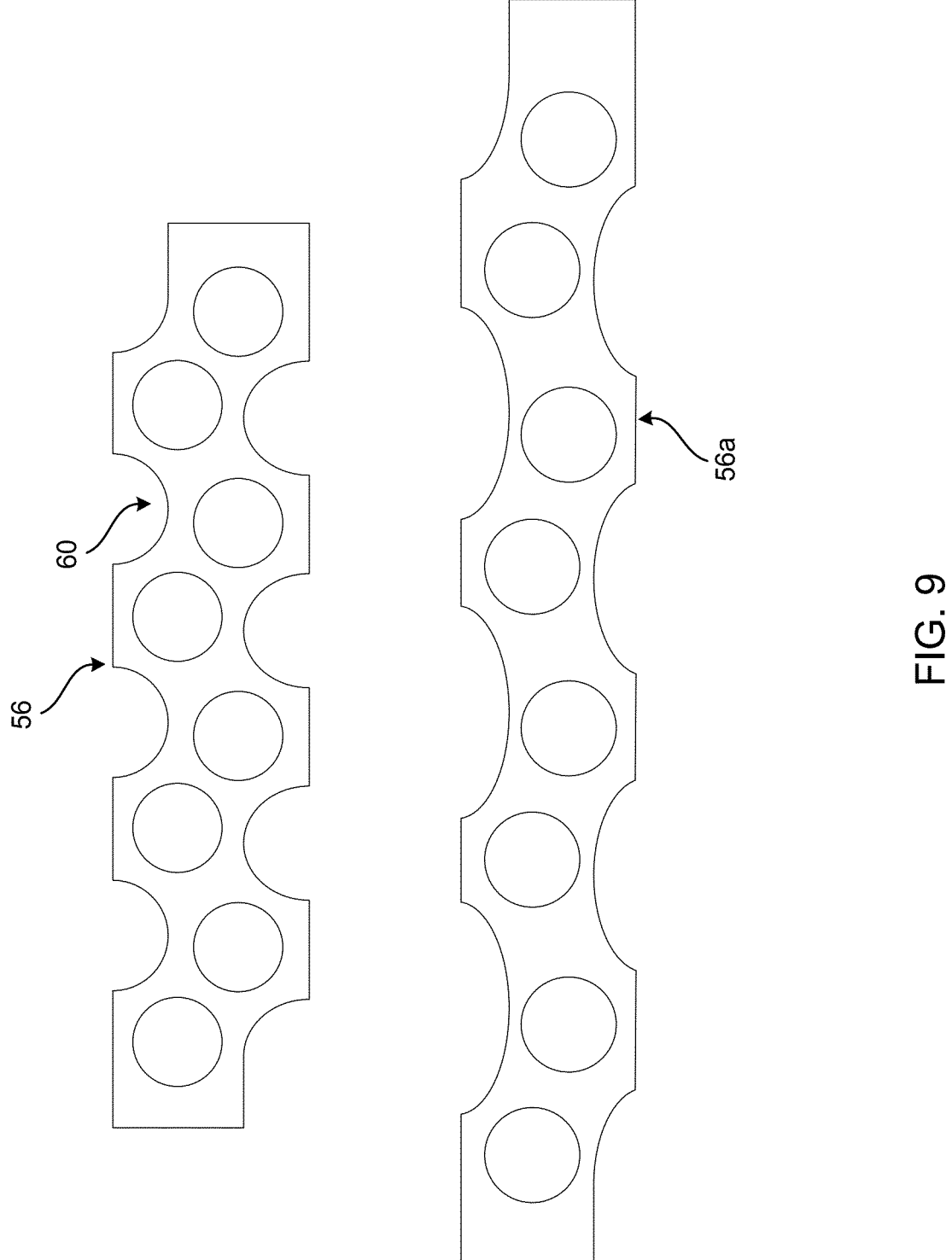
FIG. 9 illustrates manifold assembly profiles (i.e., recesses) provided to minimize air blockage by the dual-flow manifold assembly.

Since the female quick disconnect array 56 and manifold 46 (separately or combined) are bulky parts, they may block the airflow over the remaining air-cooled components on the host PCB/card 40 in a hybrid liquid/air cooled system, for example. To address this, unnecessary areas of the female quick disconnect array 56 and manifold 46 (separately or combined) can be cut away or recessed to enable more airflow pass through across the female quick disconnect array 56 and manifold 46 (separately or combined). This is illustrated in FIG. 9. Here, semicircular or arced cutouts 60 are provided, front-to-back, in the bulk material of the female quick disconnect array 56 and manifold 46 (separately or combined) between the holes 56a, although other shapes and orientations may be used equally. This provides airflow channels through and around the female quick disconnect array 56 and manifold 46 (separately or combined).

Thus, the present disclosure provides a liquid-cooled small form factor POM that utilizes quick disconnects that are arranged to minimize plug-to-plug pitch and mate with a dual-flow (i.e., 2-plenum) manifold assembly that is disposed on the PCB of a card, circuit pack, or module. By integrating liquid cooling into the POM, the dry/sliding interface is eliminated, as well as the dry/sliding thermal penalty associated with riding heatsinks. Further, using liquid cooling meaningfully improves cooling performance, with the coldplate used extending to components in the nose of the POM, typically disposed outside of the associated faceplate after insertion. A new POM may be provided, and existing POMs may be upgraded to integrate liquid cooling and eliminate this dry/sliding interface. The female quick disconnect array associated with the dual-flow manifold assembly complements the minimized plug-to-plug pitch of the POM. Two manifolds or plenums combined into one manifold assembly reduce the size and cost of fluid distribution. This idea can be used in tight spaces to allow more space for other devices. Thus, the present disclosure allows for the thermal management of high-power POMs (e.g., QSFP-DDs), which otherwise are extremely challenging to cool, allows for increasing the port density of high-power plugs at the faceplate, and allows future liquid cooling to be achieved in limited space applications.

The present disclosure provides the integration of liquid cooling into small form factor POMs while maintaining minimum plug-to-plug pitch and the integration of blind mate liquid quick disconnects into the POMs. This integration can be done in two ways: making a liquid-cooled plug (during the plug manufacturing process) by replacing the plug case top with a coldplate equipped with liquid quick disconnects and upgrading an existing plug by attaching a coldplate featuring liquid quick disconnects to the plug case top using a thermal interface material. Thus, the present disclosure enables turning existing POMs into liquid-cooled POMs. A female quick disconnect array at the dual-flow manifold assembly combines multiple female quick disconnects (thereby minimizing the spacing required). The dual-flow (i.e., 2-plenum) manifold assembly is provided in combination with the female quick disconnect array. This allows parallel flow to faceplate liquid-cooled POMs. Tapered distribution channels may also help control flow rate along the length of the manifold assembly.

Although the present disclosure is illustrated and described with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A pluggable optical module, comprising:
a body;
a coldplate coupled to the body; and
a pair of cooling fluid supply and return line quick disconnects coupled to the coldplate and extending from the coldplate and the body;
wherein the pair of cooling fluid supply and return line quick disconnects are separate components or are coupled together as a single component, wherein the separate components or the single component are coupled to the coldplate and the body using one or more securement mechanisms.

2. The pluggable optical module of claim 1, wherein the coldplate extends to a nose of the body and is disposed adjacent to components disposed in the nose of the body.

3. The pluggable optical module of claim 1, wherein the coldplate is integrated into the body.

4. The pluggable optical module of claim 1, wherein the coldplate is coupled adjacent to an exterior surface of the body using one or more securement mechanisms, and wherein a thermal interface material is disposed between the coldplate and the exterior surface of the body.

5. The pluggable optical module of claim 1, wherein the body and the coldplate are adapted to be inserted into a host card, circuit pack, or module as an integrated unit, with the pair of cooling fluid supply and return line quick disconnects adapted to fluidly engage a corresponding pair of cooling fluid supply and return line quick disconnects coupled to fluid supply and return manifolds or plenums disposed in the host card, circuit pack, or module.

6. The pluggable optical module of claim 5, wherein the pair of cooling fluid supply and return line quick disconnects coupled to the coldplate are male quick disconnects.

7. The pluggable optical module of claim 5, wherein the corresponding pair of cooling fluid supply and return line quick disconnects are female quick disconnects.

8. The pluggable optical module of claim 1, wherein the pair of cooling fluid supply and return line quick disconnects are disposed diagonally on an insertion end of the pluggable optical module, with each of the pair of cooling fluid supply and return line quick disconnects vertically offset with respect to a lateral axis of the coldplate and/or the body.

9. The pluggable optical module of claim 1, wherein a vertical offset minimizes plug-to-plug pitch on a faceplate of a host card, circuit pack, or module when the pluggable optical module is inserted into the faceplate of the host card, circuit pack, or module.

10. The pluggable optical module of claim 1, wherein the pair of cooling fluid supply and return line quick disconnects are disposed horizontally on an insertion end of the pluggable optical module, with each of the pair of cooling fluid supply and return line quick disconnects side-by-side adjacent along a lateral axis of the coldplate and/or the body.

11. A female quick disconnect array assembly, comprising:
a structure defining a plurality of embedded female quick disconnect outer housings; and
a plurality of female quick disconnect inner valves disposed within the plurality of embedded female quick disconnect outer housings;
wherein the plurality of embedded female quick disconnect outer housings and the plurality of female quick disconnect inner valves form a plurality of female quick disconnects adapted to receive a corresponding plurality of male quick disconnects associated with one or more pluggable optical modules; and
wherein the structure defines one or more recesses or cutouts, front-to-back, in a top and/or bottom surface of the structure, providing one or more airflow channels through and around the structure.

12. The female quick disconnect array assembly of claim 11, wherein each of the embedded female quick disconnect outer housings is sized to accommodate quick disconnect misalignment by providing a degree of tolerance for receiving the associated inner valve within the outer housing.

13. The female quick disconnect array assembly of claim 11, wherein each of the embedded female quick disconnect outer housings receives a sealing O-ring of the associated inner valve against a back wall of the embedded female quick disconnect outer housing to prevent leakage.

14. The female quick disconnect array assembly of claim 11, further comprising a wall coupled to the structure to secure the plurality of female quick disconnect inner valves within the plurality of embedded female quick disconnect outer housings.

15. The female quick disconnect array assembly of claim 11, wherein the structure is fluid coupled to cooling fluid supply and return lines via one or more plenums or manifolds.

16. The female quick disconnect array assembly of claim 11, wherein the structure is a manifold comprising plenums coupled to cooling fluid supply and return lines.

17. The female quick disconnect array assembly of claim 11, wherein a fluid supply-return pair of the female quick disconnects are disposed diagonally on a face of the structure, with each of the pair of the female quick disconnects vertically offset with respect to a lateral axis of the structure.

18. The female quick disconnect array assembly of claim 11, wherein a fluid supply-return pair of the female quick disconnects are disposed horizontally on a face of the structure, with each of the pair of the female quick disconnects side-by-side adjacent along a lateral axis of the structure.

19. A method for providing a pluggable optical module, comprising:

providing a pluggable optical module body;

coupling a coldplate adjacent to an exterior surface of the pluggable optical module body using one or more securement mechanisms;

disposing a thermal interface material in between the coldplate and the exterior surface of the pluggable optical module body; and coupling a pair of cooling fluid supply and return line quick disconnects to the coldplate and extending from the coldplate and the pluggable optical module body;

wherein the pair of cooling fluid supply and return line quick disconnects are separate components or are coupled together as a single component, wherein the separate components or the single component are coupled to the coldplate and the pluggable optical module body using one or more securement mechanisms; and wherein the pluggable optical module body and the coldplate are adapted to be inserted into a host card, circuit pack, or module as an integrated unit.

* * * * *